US007094691B2

United States Patent
Pan et al.

(10) Patent No.: US 7,094,691 B2
(45) Date of Patent: Aug. 22, 2006

(54) MOCVD OF TUNGSTEN NITRIDE THIN FILMS USING $W(CO)_6$ AND $NH_3$ FOR COPPER BARRIER APPLICATIONS

(75) Inventors: Wei Pan, Vancouver, WA (US); Robert Barrowcliff, Vancouver, WA (US); David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 139 days.

(21) Appl. No.: 10/410,029

(22) Filed: Apr. 9, 2003

(65) Prior Publication Data

US 2004/0203234 A1   Oct. 14, 2004

(51) Int. Cl.
*H01L 21/44* (2006.01)
(52) U.S. Cl. ............................ 438/680; 438/685
(58) Field of Classification Search ................ 438/681, 438/728, 679–680, 682
See application file for complete search history.

(56) References Cited

U.S. PATENT DOCUMENTS 5,429,989 A * 7/1995 Fiordalice et al. .......... 438/648
6,767,582 B1 * 7/2004 Elers ........................... 427/253
2003/0198587 A1 * 10/2003 Kaloyeros et al. .......... 423/409
2004/0142557 A1 * 7/2004 Levy et al. .................. 438/680

OTHER PUBLICATIONS

Yu et al. Critical Surface Reactions in the CVD of tungsten by $WF_6$ and $WF_6/SIH_4$ *Mixtures*. Materials Research Society. 1989. pp 221-230.

* cited by examiner

*Primary Examiner*—Dung A. Le
(74) *Attorney, Agent, or Firm*—David C. Ripma; Joseph P. Curtin; David Cordeiro

(57) ABSTRACT

A method of forming a tungsten nitride thin film in an integrated circuit includes preparing a silicon substrate on a silicon wafer and placing the silicon wafer in a heatable chuck in a CVD vacuum chamber; placing a known quantity of a tungsten source in a variable-temperature bubbler to provide a gaseous tungsten source; setting the variable-temperature bubbler to a predetermined temperature; passing a carrier gas through the variable-temperature bubbler and carrying the gaseous tungsten source with the carrier gas into the CVD vacuum chamber; introducing a nitrogen-containing reactant gas into the CVD vacuum chamber; reacting the gaseous tungsten source and the nitrogen-containing reactant gas above the surface of the silicon wafer in a deposition process to deposit a $W_xN_y$ thin film on the surface of the silicon wafer; and completing the integrated circuit containing the $W_xN_y$ thin film.

17 Claims, 1 Drawing Sheet

US 7,094,691 B2

MOCVD OF TUNGSTEN NITRIDE THIN FILMS USING W(CO)$_6$ AND NH$_3$ FOR COPPER BARRIER APPLICATIONS

FIELD OF THE INVENTION

This invention relates to the MOCVD of barrier metal thin films for copper interconnect applications, and specifically to a method of depositing a tungsten a nitride thin film without fluorine contamination of associate IC structures.

BACKGROUND OF THE INVENTION

In the semiconductor industry, tungsten thin films are usually deposited through use of a WF$_6$ precursor and a H$_2$ or SiH$_4$ carrier gas. This process, however, is not able to form a WN thin film from a WF$_6$ precursor and a NH$_3$ reactant gas, because, when WF$_6$ is used, there is always a fluorine contamination problem. This requires deposition of an extra barrier layer, such as TiN, to prevent direct contact of Si or SiO$_2$ and WF$_6$. See Yu et al., *Critical Surface Reactions in the CVD of Tungsten by WF$_6$ and WF$_6$/SiH$_4$ Mixtures*, Materials Research Society, 1989, pp 221–230.

SUMMARY OF THE INVENTION

A method of forming a tungsten nitride thin film in an integrated circuit includes preparing a silicon substrate on a silicon wafer and placing the silicon wafer in a heatable chuck in a CVD vacuum chamber; placing a known quantity of a tungsten source in a variable-temperature bubbler to provide a gaseous tungsten source; setting the variable-temperature bubbler to a predetermined temperature; passing a carrier gas through the variable-temperature bubbler and carrying the gaseous tungsten source with the carrier gas into the CVD vacuum chamber; introducing a nitrogen-containing reactant gas into the CVD vacuum chamber; reacting the gaseous tungsten source and the nitrogen-containing reactant gas above the surface of the silicon wafer in a deposition process to deposit a W$_x$N$_y$ thin film on the surface of the silicon wafer; and completing the integrated circuit containing the W$_x$N$_y$ thin film.

It is an object of the invention to provide a method of forming a W$_x$N$_y$ thin film.

Another object of the invention to provide a method of forming a W$_x$N$_y$ thin film using a solid tungsten precursor and a nitrogen-containing reactant gas.

A further object of the invention to provide a method of forming a W$_x$N$_y$ thin film which does not require the use of a fluorine-containing component.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

Figure 1:
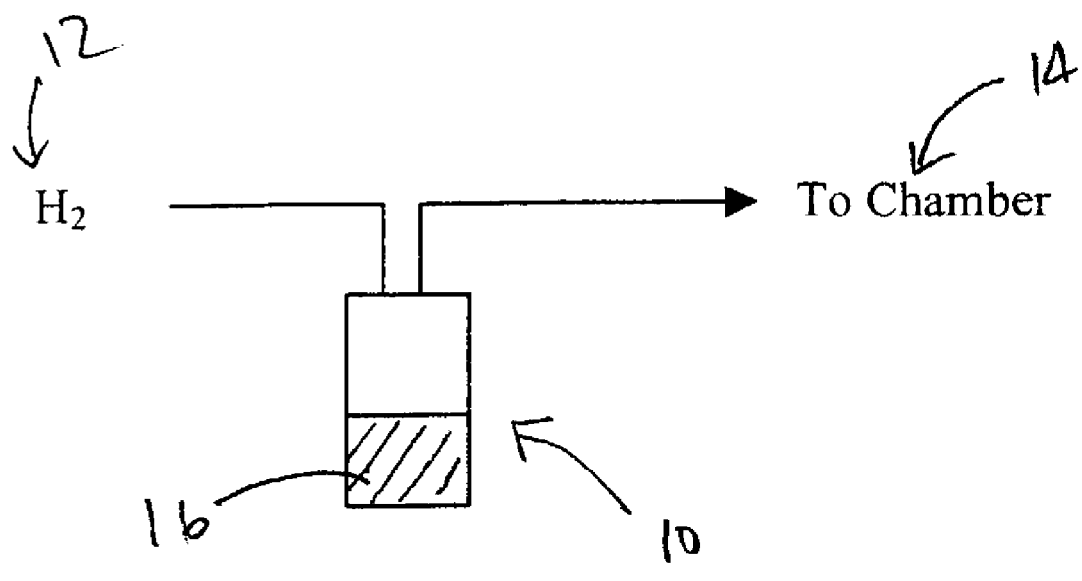
FIG. 1 depicts a portion of the apparatus used to practice the method of the invention.

The method of the invention describes how to deposit a tungsten nitride thin film using a solid tungsten precursor, W(CO)$_6$, and a nitrogen-containing reactant gas, NH$_3$. The resulting as-deposited films is specula and conductive, having a polycrystalline cubic W$_2$N phase.

Referring now to FIG. 1, a variable-temperature bubbler 10 is placed between a hydrogen carrier gas source 12 and a chemical vapor deposition (CVD) chamber 14, which is suitable for metal organic CVD (MOCVD). W(CO)$_6$ powder 16 is placed in bubbler 10, which may be kept at room temperature or heated to a temperature of up to about 200° C., so long as the predetermined temperature of the variable-temperature bubbler is known. This is important because the vapor pressure of W(CO)$_6$ varies proportionally with bubbler temperature. Hydrogen gas is used to carry W(CO)$_6$ vapor into the MOCVD chamber, where the tungsten source is mixed with a nitrogen-containing reactant gas, such as NH$_3$ gas. The tungsten source undergoes a thermal decomposition process, and is reacted with NH$_3$ gas on the heated substrate surface to form a W$_x$N$_y$ thin film. The flow rates of the H$_2$ carrier gas and the NH$_3$ reactant gas are varied from between about 20 sccm to 200 sccm. The substrate temperature is in a range of between about 350° C. to 430° C. Pressure in the MOCVD chamber is maintained between about 300 mtorr to 1000 mtorr. The deposition time is from about one minute to sixty minutes. The resulting W$_x$N$_y$ films are shiny and conductive. The resistivity of a 50 nm thick W$_x$N$_y$ thin film is about 500 μohm-cm. X-ray diffraction analysis demonstrates that neither tungsten carbide nor tungsten in a metal-phase is present in the as-deposited thin films. The W$_x$N$_y$ phase is polycrystalline cubic W$_2$N. The solid W(CO)$_6$ source, used in the method of the invention, is quite benign with respect to Si or SiO$_2$, therefore, the tungsten nitride films made from W(CO)$_6$ and NH$_3$ is suitable for use as a copper barrier.

EXAMPLE

A solid tungsten source, such as W(CO)$_6$ powder, used for depositing WN films, is placed in a bubbler 10. W(CO)$_6$ vapor is carried by hydrogen gas into MOCVD chamber 14. Inside MOCVD vacuum chamber 14, a silicon substrate is placed on a heated chuck and the substrate is heated to approximately 430° C. NH$_3$ and H$_2$ gas are introduced into the MOCVD vacuum chamber until a chamber pressure of approximately 500 mtorr is reached. Hydrogen gas carries W(CO)$_6$ vapor into the MOCVD chamber from the bubbler, which bubbler is maintained at room temperature. The preferred flow rates for NH$_3$ and H$_2$ are 20 sccm and 100 sccm, respectively. The deposition process continues for about three minutes, which results in a W$_2$N film having a thickness of about 50 nm, and having a resistivity of about 500 μohm-cm.

Thus, a method for MOCVD of tungsten nitride thin films using W(CO)$_6$ and NH$_3$ for barrier applications has been disclosed, which is particularly useful for copper barrier applications. It will be appreciated that further variations and modifications thereof may be made within the scope of the invention as defined in the appended claims.

We claim:

1. A method of forming a tungsten nitride thin film in an integrated circuit, comprising:

preparing a silicon substrate on a silicon wafer and placing the silicon wafer in a heatable chuck in a CVD vacuum chamber and heating the silicon wafer to a temperature of between about 350° C. to 430° C.;

placing a known quantity of W(CO)$_6$ in a variable-temperature bubbler to provide a gaseous tungsten source;

setting the variable-temperature bubbler to a predetermined temperature;

passing a carrier gas through the variable-temperature bubbler and carrying the gaseous tungsten source with the carrier gas into the CVD vacuum chamber;

introducing a nitrogen-containing reactant gas into the CVD vacuum chamber;

reacting the gaseous tungsten source and the nitrogen-containing reactant gas above the surface of the silicon wafer in a deposition process to deposit a polycrystalline cubic phase $W_xN_y$ thin film barrier layer on the surface of the silicon wafer, and completing the integrated circuit containing the $W_xN_y$ thin film.

2. The method of claim 1 wherein said setting the variable-temperature bubbler to a predetermined temperature includes setting the variable-temperature bubbler to a temperature of between about ambient room temperature and 200° C.

3. The method of claim 1 wherein said passing a carrier gas through the variable-temperature bubbler includes passing hydrogen gas through the variable-temperature bubbler.

4. The method of claim 3 wherein said passing hydrogen gas through the variable-temperature bubbler at a flow rate of between about 20 sccm to 200 sccm.

5. The method of claim 1 wherin said introducing a nitrogen-containing reactant gas into the CVD vacuum chamber includes introducing gaseous $NH_3$ into the CVD vacuum chamber.

6. The method of claim 5 wherein said introducing $NH_3$ gas into the CVD vacuum chamber includes introducing $NH_3$ gas at a flow rate of between about 20 sccm to 200 sccm.

7. The method of claim 1 wherein said reacting the gaseous tungsten source and the nitrogen-containing reactant gas above the surface of the silicon wafer in a deposition process to deposit a $W_xN_y$ thin film on the surface of the silicon wafer includes forming a $W_2N$ thin film on the surface of the silicon wafer.

8. The method of claim 7 wherein said foring a $W_2N$ thin film on the surface of the silicon wafer includes maintaining the pressure in the CVD vacuum chamber at between about 30 mtorr and 1000 mtorr.

9. The method of claim 7 wherein said forming a $W_2N$ thin film on the surface of the silicon wafer includes running the deposition process for a time of between about one minute and 60 minutes.

10. A method of forming a tungsten nitride thin film in an integrated circuit, comprising:

preparing a silicon substrate on a silicon wafer and placing the silicon wafer in a heatable chuck in a CVD vacuum chamber and heating the silicon wafer to a temperature of between about 350° C. to 430° C.;

placing a known quantity of $W(CO)_6$ in a variable-temperature bubbler to provide gaseous $W(CO)_6$;

setting the variable-temperature bubbler to a predetermined temperature;

passing a hydrogen carrier gas through the variable-temperature bubbler and carrying the gaseous $W(CO)_6$ with the hydrogen carrier gas into the CVD vacuum chamber;

introducing $NH_3$ reactant gas into the CVD vacuum chamber;

reacting the gaseous $W(CO)_6$ and the $NH_3$ reactant gas above the surface of the silicon wafer in a deposition process to deposit a polycrystalline cubic phase $W_2N$ thin film barrier layer on the surface of the silicon wafer; and completing the integrated circuit containing the $W_2N$ thin film.

11. The method of claim 10 wherein said setting the variable-temperature bubbler to a predetermined temperature includes setting the variable-temperature bubbler to a temperature of between about ambient room tempertature and 200° C.

12. The method of claim 10 wherein said passing hydrogen gas through the variable-teniperature bubbler at a flow rate of between about 20 sccm to 200 sccm.

13. The method of claim 5 wherein said introducing $NH_3$ has into the CVD vacuum chamber includes introducing $NH_3$ gas at a flow rate of between about 20 sccm to 200 sccm.

14. The method of claim 10 wherein said forming a $W_2N$ thin film on the surface of the silicon wafer includes maintaining the pressure in the CVD vacuum chamber at between about 30 mtorr and 1000 mtorr.

15. The method of claim 10 wherein said forming a $W_2N$ thin film on the surface of the silicon wafer includes running the deposition process for a time of between about one minute and 60 minutes.

16. A method of forming a tungsten nitride thin film in an integrated circuit, comprising:

preparing a silicon substrate on a silicon wafer and placing the silicon wafer in a heatable chuck in a CVD vacuum chamber, heating the silicon wafer to a temperature of between about 350° C. to 430° C., and maintaining the pressure in the CVD vacuum chamber at between about 30 mtorr. and 1000 mtorr;

placing a known quantity of $W(CO)_6$ in a variable-temperature bubbler to provide gaseous $W(CO)_6$;

setting the variable-temperature bubbler to a predetermined temperature;

passing a hydrogen carrier gas through the variable-temperature bubbler and carrying the gaseous $W(CO)_6$ with the hydrogen earlier gas into the CVD vacuum chamber;

introducing $NH_3$ reactant gas into the CVD vacuum chamber;

reacting the gaseous $W(CO)_6$ and the $NH_3$ reactant gas above the surface of the silicon wafer in a deposition process to deposit a polycrystalline cubic phase $W_2N$ thin film on the surface of the silicon wafer for between about one minute and 60 minutes; and completing the integrated circuit containing the $W_2N$ thin film.

17. The method of claim 16 wherein said setting the variable-temperature bubbler to a predetermined temperature includes setting the variable-temperature bubbler to a temperature of between about ambient room temperature and 200° C.; wherein said passing hydrogen gas through the variable-temperature bubbler at a flow rate of between about 20 sccm to 200 sccm; and wherein said introducing $NH_3$ gas into the CVD vacuum chamber includes introducing $NH_3$ gas at a flow rate of between about 20 scorn to 200 sccm.

* * * * *